(12) United States Patent
Nabeshima

(10) Patent No.: US 11,097,310 B2
(45) Date of Patent: Aug. 24, 2021

(54) PAINT HARDENING DEVICE AND PAINT HARDENING METHOD

(71) Applicant: TOYOTA JIDOSHA KABUSHIKI KAISHA, Toyota (JP)

(72) Inventor: Atsuo Nabeshima, Toyota (JP)

(73) Assignee: TOYOTA JIDOSHA KABUSHIKI KAISHA, Aichi-ken (JP)

( * ) Notice: Subject to any disclaimer, the term of this patent is extended or adjusted under 35 U.S.C. 154(b) by 0 days.

(21) Appl. No.: 16/822,624

(22) Filed: Mar. 18, 2020

(65) Prior Publication Data

US 2020/0306792 A1 Oct. 1, 2020

(30) Foreign Application Priority Data

Mar. 28, 2019 (JP) .............................. JP2019-063347
Nov. 7, 2019 (JP) .............................. JP2019-202517

(51) Int. Cl.
  *B05D 3/06* (2006.01)
  *H01J 27/20* (2006.01)
  *H01J 37/20* (2006.01)
  *H01J 37/21* (2006.01)

(52) U.S. Cl.
  CPC .............. *B05D 3/068* (2013.01); *H01J 27/20* (2013.01); *H01J 37/20* (2013.01); *H01J 37/21* (2013.01); *H01J 2237/006* (2013.01); *H01J 2237/204* (2013.01); *H01J 2237/20278* (2013.01)

(58) Field of Classification Search
  CPC ....... B05D 3/068; B05D 3/0466; H01J 27/20; H01J 37/21; H01J 37/20; H01J 2237/006; H01J 2237/204; H01J 2237/20278; G21K 5/08; G21K 5/10

USPC ........................................... 250/492.1, 492.3
See application file for complete search history.

(56) References Cited

U.S. PATENT DOCUMENTS

| 6,188,075 | B1 * | 2/2001 | Takayama | ................ | G21K 5/04 |
| | | | | | 250/492.3 |
| 6,545,398 | B1 * | 4/2003 | Avnery | .................... | G21K 5/04 |
| | | | | | 313/360.1 |
| 6,727,508 | B1 * | 4/2004 | Tominaga | ................ | B01J 19/22 |
| | | | | | 250/492.1 |
| 2002/0139939 | A1 | 10/2002 | Takayama et al. | | |

(Continued)

FOREIGN PATENT DOCUMENTS

| EP | 1100109 A1 | 5/2001 |
| JP | 04-106677 U | 9/1992 |

(Continued)

*Primary Examiner* — David A Vanore
(74) *Attorney, Agent, or Firm* — Sughrue Mion, PLLC

(57) ABSTRACT

A paint hardening device is a device for hardening paint applied to a workpiece and includes an electron beam emission portion configured to emit an electron beam to harden the paint, and a storage chamber in which the electron beam emission portion is accommodated. The paint hardening device is configured to move the workpiece and the electron beam emission portion relative to each other while the electron beam is being applied to the paint from the electron beam emission portion in a state where an inert gas atmosphere is formed at least in an electron-beam passing region where the electron beam passes in the storage chamber, the electron beam being applied to the paint from the electron beam emission portion.

9 Claims, 10 Drawing Sheets

(56) References Cited

U.S. PATENT DOCUMENTS

| | | | | |
|---|---|---|---|---|
| 2005/0173654 | A1* | 8/2005 | Usami | G21K 5/04 |
| | | | | 250/492.1 |
| 2007/0205381 | A1* | 9/2007 | Nakao | G21K 5/10 |
| | | | | 250/492.3 |
| 2008/0239043 | A1* | 10/2008 | Nakazawa | B41J 11/002 |
| | | | | 347/102 |
| 2018/0194957 | A1* | 7/2018 | Makuta | C09D 11/322 |
| 2019/0039372 | A1* | 2/2019 | Kinoshita | B41J 11/002 |
| 2019/0083994 | A1* | 3/2019 | Tani | B05B 5/0407 |
| 2019/0310194 | A1* | 10/2019 | Weisbecker | G01N 33/442 |
| 2019/0352519 | A1* | 11/2019 | Zhou | C08G 18/12 |
| 2020/0306792 | A1* | 10/2020 | Nabeshima | H01J 27/20 |

FOREIGN PATENT DOCUMENTS

| | | |
|---|---|---|
| JP | 10-123300 A | 5/1998 |
| JP | 2001-143983 A | 5/2001 |
| JP | 3237546 B2 | 10/2001 |
| JP | 2005-205341 A | 8/2005 |

\* cited by examiner

PAINT HARDENING DEVICE AND PAINT HARDENING METHOD

CROSS-REFERENCE TO RELATED APPLICATIONS

This application claims priority to Japanese Patent Application No. 2019-063347 filed on Mar. 28, 2019 and Japanese Patent Application No. 2019-202517 filed on Nov. 7, 2019, each incorporated herein by reference in its entirety.

BACKGROUND

1. Technical Field

The present disclosure relates to a paint hardening device and a paint hardening method.

2. Description of Related Art

In the related art, there has been known a paint hardening device for hardening paint by an electron beam, the paint being applied to a workpiece (for example, see Japanese Unexamined Patent Application Publication No. 10-123300 (JP 10-123300 A)).

The paint hardening device in JP 10-123300 A includes an electron beam emission portion configured to emit an electron beam to harden the paint, and a robot arm having a distal end provided with the electron beam emission portion. The robot arm is configured to cause the electron beam emission portion to scan the paint applied to the workpiece. Hereby, even in a case where the workpiece has a curved surface, the electron beam can be appropriately applied to the paint.

SUMMARY

Here, when the electron beam collides with oxygen at the time when the electron beam is applied to the paint from the electron beam emission portion, ozone might be generated.

The present disclosure has been accomplished in order to solve the above problem, and an object of the present disclosure is to provide a paint hardening device and a paint hardening method each of which can restrain generation of ozone.

A paint hardening device according to the present disclosure is a paint hardening device for hardening paint applied to a workpiece. The paint hardening device includes an electron beam emission portion and a storage chamber. The electron beam emission portion is configured to emit an electron beam to harden the paint. In the storage chamber, the electron beam emission portion is accommodated. The paint hardening device is configured to move the workpiece and the electron beam emission portion relative to each other while the electron beam is being applied to the paint from the electron beam emission portion in a state where an inert gas atmosphere is formed at least in an electron-beam passing region where the electron beam passes in the storage chamber, the electron beam being applied to the paint from the electron beam emission portion.

In such a configuration, when the inert gas atmosphere is formed in the electron-beam passing region, it is possible to restrain the electron beam from colliding with oxygen. This makes it possible to restrain generation of ozone.

The paint hardening device may include a gas supply portion configured to supply inert gas into the storage chamber.

With such a configuration, by supplying inert gas into the storage chamber from the gas supply portion, the electron-beam passing region can have an inert gas atmosphere.

The paint hardening device may include a robot arm having a distal end provided with the electron beam emission portion, the robot arm being configured to move the electron beam emission portion.

With such a configuration, the electron beam emission portion can be moved relative to the workpiece by use of the robot arm.

The paint hardening device may include a workpiece conveyance portion including a holding portion configured to hold the workpiece, and a transfer portion configured to transfer the holding portion. The holding portion may be configured to move the workpiece relative to the transfer portion, the workpiece being held by the holding portion.

With such a configuration, the workpiece can be moved relative to the electron beam emission portion by use of the holding portion.

The paint hardening device may include a workpiece conveyance portion including a holding portion configured to hold the workpiece, and a transfer portion configured to transfer the holding portion. The holding portion may be configured to move the workpiece relative to the transfer portion, the workpiece being held by the holding portion. The electron beam emission portion may be provided on an inner surface of the storage chamber and may be configured to be movable horizontally.

With such a configuration, the electron beam emission portion is moved along the inner surface, so that the electron beam emission portion can be moved in a stable state.

The paint hardening device may include a workpiece conveyance portion including a holding portion configured to hold the workpiece, and a transfer portion configured to transfer the holding portion. The holding portion may be configured to move the workpiece relative to the transfer portion, the workpiece being held by the holding portion. The electron beam emission portion may be fixed to an inner surface of the storage chamber.

With such a configuration, the workpiece and the electron beam emission portion can be moved relative to each other while the electron beam emission portion is stabilized.

The paint hardening device may include a gas blowing portion configured to blow inert gas to the electron-beam passing region.

With such a configuration, by blowing inert gas from the gas blowing portion, the electron-beam passing region can have an inert gas atmosphere.

In the paint hardening device, the electron beam emission portion may be configured to emit an electron beam having a width narrower than an electron-beam applied region in the workpiece.

With such a configuration, the electron beam can be applied to the paint on the workpiece while a distance between the electron beam emission portion and the paint on the workpiece, and so on are adjusted in accordance with the shape of the workpiece.

In the paint hardening device, the workpiece may be formed in a three-dimensional shape.

With such a configuration, the paint applied to the workpiece formed in the three-dimensional shape can be hardened.

A paint hardening method according to the present disclosure is a method for hardening paint by an electron beam, the paint being applied to a workpiece. The paint hardening method includes: a step of forming an inert gas atmosphere at least in an electron-beam passing region where the electron beam passes in a storage chamber in which an electron beam emission portion is stored, the electron beam being applied to the paint from the electron beam emission portion; a step of applying the electron beam to the paint from the electron beam emission portion in a state where the inert gas atmosphere is formed in the electron-beam passing region; and a step of moving the workpiece and the electron beam emission portion relative to each other while the electron beam is being applied to the paint from the electron beam emission portion.

In such a configuration, when the inert gas atmosphere is formed in the electron-beam passing region, it is possible to restrain the electron beam from colliding with oxygen. This makes it possible to restrain generation of ozone.

With the paint hardening device and the paint hardening method of the present disclosure, it is possible to restrain generation of ozone.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein:

FIG. 8A is viewed from above;

FIG. 9A is viewed from above;

FIG. 10A is viewed from above;

DETAILED DESCRIPTION OF EMBODIMENTS

The following describes embodiments of the present disclosure.

First Embodiment

Figure 1:
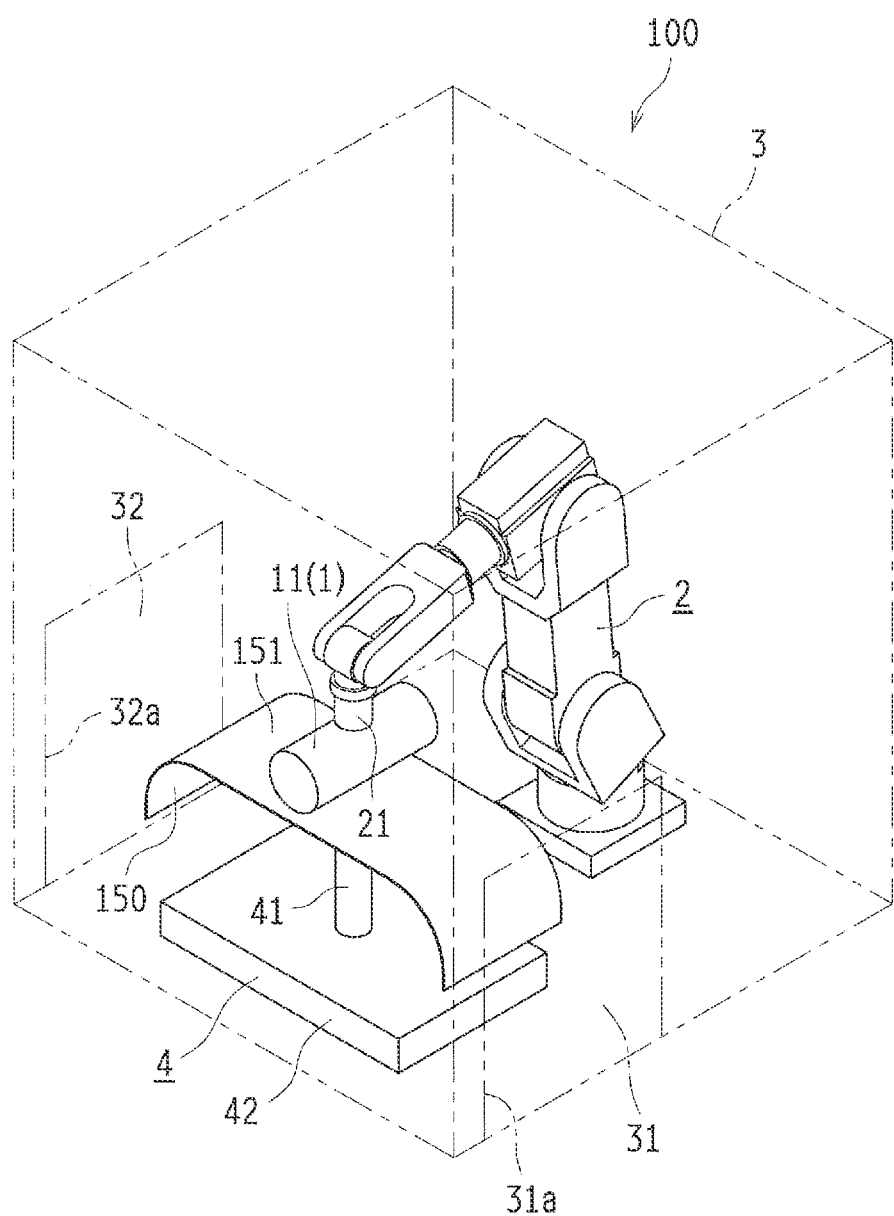
FIG. 1 is a perspective view illustrating a schematic configuration of a paint hardening device according to a first embodiment.

First described is a paint hardening device 100 according to a first embodiment of the present disclosure with reference to FIG. 1.

The paint hardening device 100 is provided in a production line of a factory, for example, and the paint hardening device 100 is configured to harden paint 151 by an electron beam, the paint 151 being applied to a workpiece 150. In the production line of the factory, a coating applicator (not shown) configured to apply the paint 151 to the workpiece 150 is placed on the upstream side of the paint hardening device 100. The paint 151 is an electron-beam curable paint. An inspection device (not shown) configured to inspect the workpiece 150 on which the paint 151 is hardened is placed on the downstream side of the paint hardening device 100. The workpiece 150 is a vehicle bumper made of resin, for example, and the workpiece 150 is formed in a three-dimensional shape having a curved portion, an uneven portion, or the like.

As illustrated in FIG. 1, the paint hardening device 100 includes an electron beam emission portion 1 configured to emit an electron beam to harden the paint 151; a robot arm 2 having a distal end 21 provided with the electron beam emission portion 1; a storage chamber 3 in which the robot arm 2 is accommodated; a workpiece conveyance portion 4 configured to convey the workpiece 150 to the storage chamber 3; and a gas supply portion 5 (see FIG. 2) connected to the storage chamber 3.

The electron beam emission portion 1 is a curtain type, for example, and is configured to emit a wide electron beam. The electron beam emission portion 1 includes a vacuum chamber 11 having a hollow pillar shape, a filament (not shown) placed inside the vacuum chamber 11, and an accelerator (not shown) configured to accelerate electrons emitted from the filament. The electron beam emission portion 1 is configured to emit the accelerated electrons through a window (not shown) formed on a peripheral surface of the vacuum chamber 11 so as to extend in a longitudinal direction of the vacuum chamber 11.

The robot arm 2 is provided so as to move the electron beam emission portion 1 provided in the distal end 21 of the robot arm 2. More specifically, the robot arm 2 is configured to cause the electron beam emission portion 1 to perform scanning along a surface of the workpiece 150 having a three-dimensional shape. The robot arm 2 is configured to move the electron beam emission portion 1 with six degrees of freedom, for example. That is, the robot arm 2 can move the electron beam emission portion 1 in an X-axis direction, a Y-axis direction, a Z-axis direction, an X-axis circumferential direction, a Y-axis circumferential direction, and a Z-axis circumferential direction.

The storage chamber 3 is a treatment chamber in which a hardening treatment is performed on the paint 151 of the workpiece 150. The storage chamber 3 is provided with a carrying-in door 31 configured to open and close a carrying-in opening 31a for the workpiece 150, and a carrying-out door 32 configured to open and close a carrying-out opening 32a for the workpiece 150. The storage chamber 3 is formed such that its inside becomes a sealed space when the carrying-in door 31 and the carrying-out door 32 are closed. Further, the storage chamber 3 is configured to block an X-ray generated inside the storage chamber 3 so that the X-ray does not leak outside the storage chamber 3.

The workpiece conveyance portion 4 is provided so as to convey, to the storage chamber 3, the workpiece 150 to which the paint 151 is applied and to carry out, from the storage chamber 3, the workpiece 150 on which the paint 151 is hardened. The workpiece conveyance portion 4 includes a holding portion 41 configured to hold the workpiece 150 and a transfer portion 42 configured to transfer the holding portion 41. The workpiece 150 held by the holding portion 41 is not moved relative to the transfer portion 42.

The gas supply portion 5 (see FIG. 2) is provided so as to supply inert gas to the storage chamber 3 and to form an inert gas atmosphere inside the storage chamber 3. The inert gas is a gas having an oxygen concentration lower than that of air and is, for example, nitrogen gas.

Operation of Paint Hardening Device

Next will be described an operation (a paint hardening method) of the paint hardening device 100 according to the first embodiment with reference to FIGS. 1 to 3.

First, the workpiece 150 to which the paint 151 has been applied is conveyed into the storage chamber 3 (see FIG. 1). More specifically, the workpiece 150 to which the paint 151 has been applied by the coating applicator (not shown) provided on the upstream side of the paint hardening device 100 is held by the holding portion 41 of the workpiece conveyance portion 4. Then, the carrying-in door 31 of the storage chamber 3 is opened, and the transfer portion 42 of the workpiece conveyance portion 4 is moved. Thus, the workpiece conveyance portion 4 holding the workpiece 150 enters the storage chamber 3 through the carrying-in opening 31a. After that, the carrying-in door 31 is closed, and the inside of the storage chamber 3 is sealed.

Subsequently, inert gas is supplied from the gas supply portion 5 (see FIG. 2) to the storage chamber 3, so that an inert gas atmosphere is formed inside the storage chamber 3. Because of this, an electron-beam passing region where an electron beam passes also has an inert gas atmosphere, the electron beam being applied to the paint 151 from the electron beam emission portion 1. That is, the electron-beam passing region has a low oxygen concentration.

Figure 2:
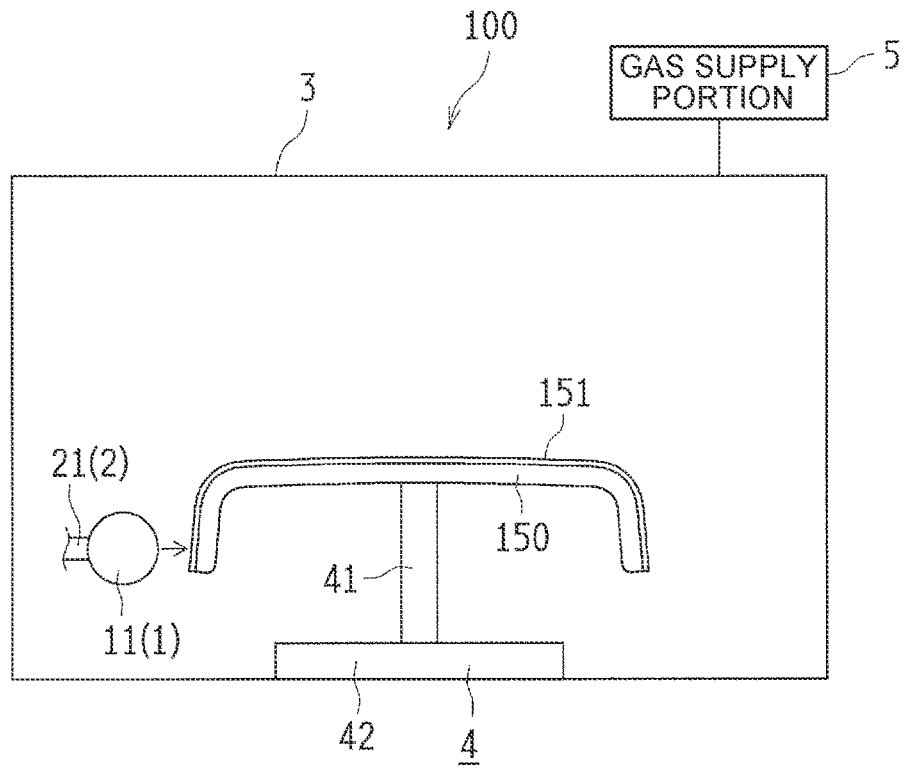
FIG. 2 is a schematic view to describe an operation of the paint hardening device according to the first embodiment.

Then, as illustrated in FIG. 2, the electron beam emission portion 1 is placed at an application start position by the robot arm 2. The application start position is a position set in advance and is distanced from a surface of the paint 151 on the workpiece 150 only by a predetermined distance. Subsequently, an electron beam is applied to the paint 151 from the electron beam emission portion 1, so that the paint 151 is hardened. At this time, an X-ray generated by the application of the electron beam is blocked by the storage chamber 3.

Figure 3:
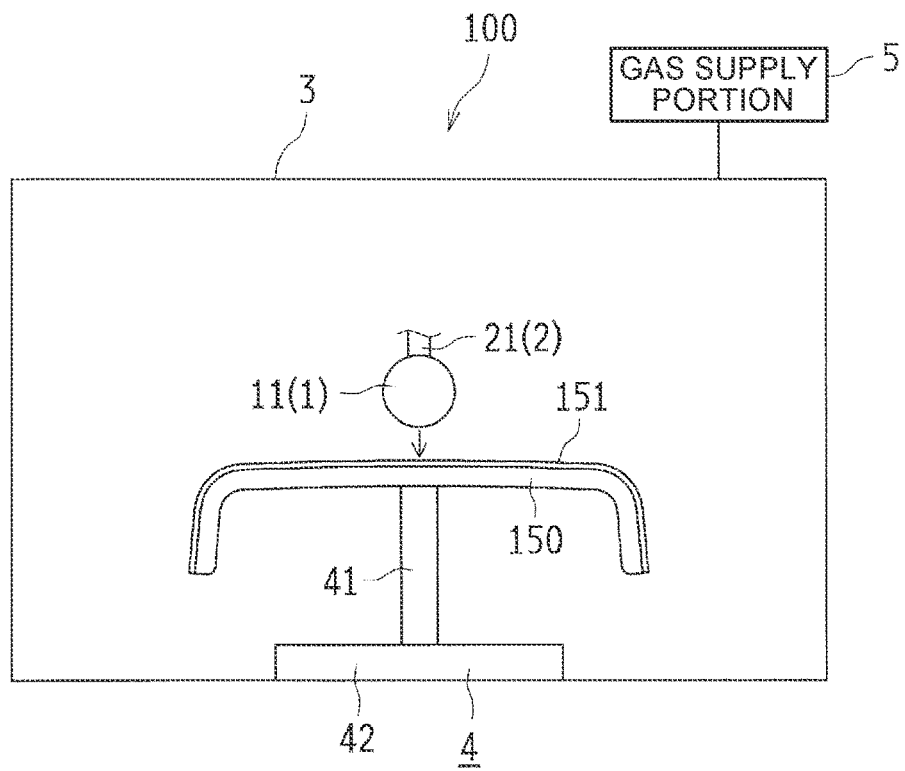
FIG. 3 is a view illustrating a state where an electron beam emission portion is moved in the paint hardening device in FIG. 2.

Further, while the electron beam is being applied to the paint 151 from the electron beam emission portion 1, the electron beam emission portion 1 performs scanning along the surface of the paint 151 on the workpiece 150 by means of the robot arm 2 as illustrated in FIG. 3. At this time, the distance between the electron beam emission portion 1 and the paint 151 is maintained to be the predetermined distance by the robot arm 2. Note that the workpiece 150 held by the workpiece conveyance portion 4 is fixed without being moved. After that, the electron beam is applied to the whole paint 151 on the workpiece 150, and when the electron beam emission portion 1 is moved to an application end position, the application of the electron beam from the electron beam emission portion 1 to the paint 151 is ended. Hereby, the whole paint 151 on the workpiece 150 is hardened.

Subsequently, the workpiece 150 on which the paint 151 is hardened is conveyed out from the storage chamber 3 (see FIG. 1). More specifically, the carrying-out door 32 of the storage chamber 3 is opened, and the transfer portion 42 of the workpiece conveyance portion 4 is moved. Hereby, the workpiece conveyance portion 4 holding the workpiece 150 exits from the storage chamber 3 through the carrying-out opening 32a. The workpiece 150 on which the paint 151 is hardened is transferred to the inspection device (not shown).

Effects

In the first embodiment, as described above, the workpiece 150 and the electron beam emission portion 1 are moved relative to each other such that the electron beam is applied to the workpiece 150 having a three-dimensional shape, and thus, the paint 151 can be hardened. Further, when an inert gas atmosphere is formed in the electron-beam passing region, it is possible to restrain the electron beam from colliding with oxygen. This makes it possible to restrain generation of ozone. Further, by forming the inert gas atmosphere, it is possible to restrain hardening of the paint 151 by application of the electron beam from being interrupted by oxygen.

Further, in the first embodiment, as the gas supply portion 5 is provided, the electron-beam passing region can have an inert gas atmosphere.

Further, in the first embodiment, as the robot arm 2 is provided, the electron beam emission portion 1 can scan the workpiece 150.

Second Embodiment

Figure 4:
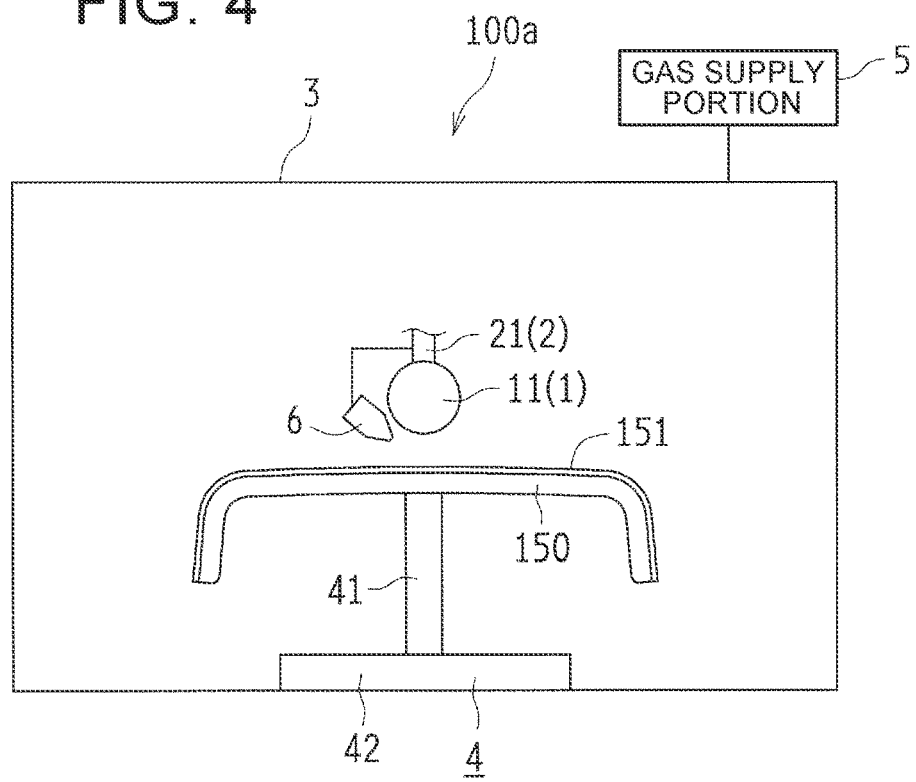
FIG. 4 is a schematic view to describe a paint hardening device according to a second embodiment.

Referring now to FIG. 4, a paint hardening device 100a according to a second embodiment of the present disclosure will be described. In the paint hardening device 100a of the second embodiment, a gas blowing portion 6 configured to blow inert gas to a space (the electron-beam passing region) between the electron beam emission portion 1 and the paint 151 is provided.

As illustrated in FIG. 4, the paint hardening device 100a includes the electron beam emission portion 1, the robot arm 2, the storage chamber 3, the workpiece conveyance portion 4, the gas supply portion 5, and the gas blowing portion 6.

The gas blowing portion 6 is provided in the distal end 21 of the robot arm 2 and is configured to blow inert gas toward the surface of the paint 151 to which the electron beam is applied. The gas blowing portion 6 is configured to blow inert gas to the electron-beam passing region at the time of application of the electron beam from the electron beam emission portion 1 to the paint 151. That is, the gas blowing portion 6 is configured to blow inert gas at the time when the electron beam emission portion 1 performs scanning from the application start position to the application end position.

Note that the other configurations and operations of the second embodiment are generally the same as those in the first embodiment.

Effects

In the second embodiment, as the gas blowing portion 6 is provided as described above, the oxygen concentration in the electron-beam passing region can be decreased more. Further, in a case where a recessed portion (not shown) is formed on the workpiece 150, and oxygen enters the recessed portion, for example, the oxygen can be blown off from the recessed portion.

Further, in the second embodiment, the gas blowing portion 6 is attached to the distal end 21 of the robot arm 2, so that the electron beam emission portion 1 and the gas blowing portion 6 are moved integrally by the robot arm 2. Accordingly, the electron-beam passing region can be easily moved while inert gas is blown to the electron-beam passing region. Further, in comparison with a case where a robot arm (not shown) configured to move the gas blowing portion is provided separately from the robot arm 2 configured to move the electron beam emission portion 1, it is possible to reduce the number of components and to achieve downsizing.

Note that the other effects of the second embodiment are the same as those in the first embodiment.

Third Embodiment

Figure 5:
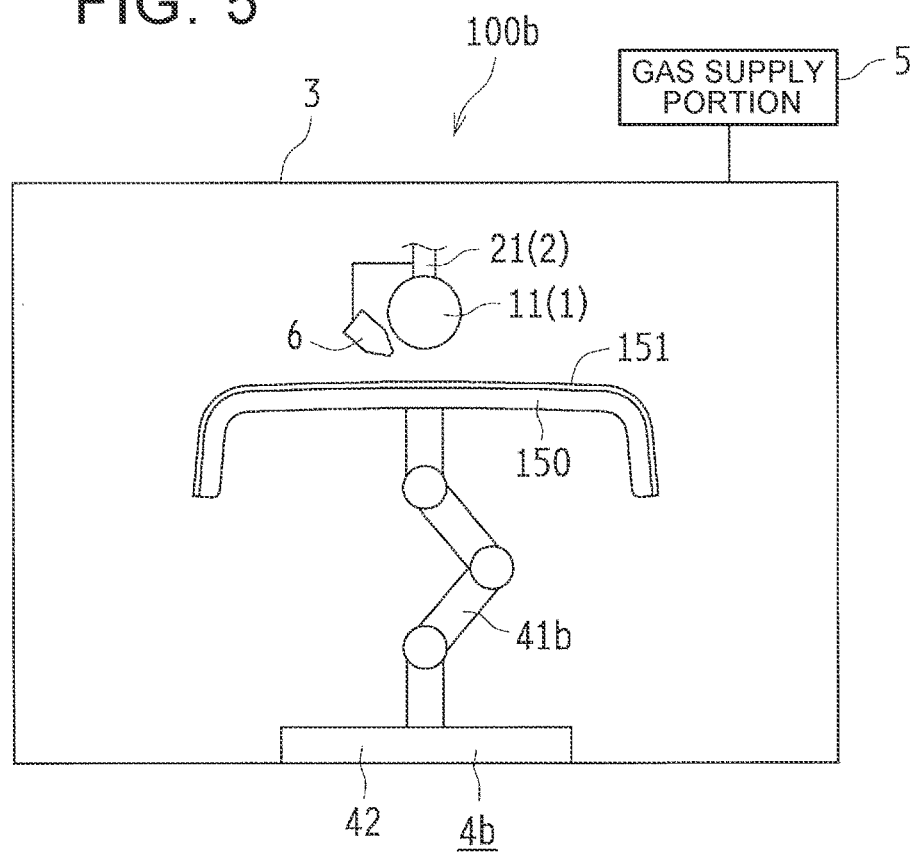
FIG. 5 is a schematic view to describe a paint hardening device according to a third embodiment.

Referring now to FIG. 5, a paint hardening device 100*b* according to a third embodiment of the present disclosure will be described. In the paint hardening device 100*b* of the third embodiment, a holding portion 41*b* of a workpiece conveyance portion 4*b* movably holds the workpiece 150.

As illustrated in FIG. 5, the paint hardening device 100*b* includes the electron beam emission portion 1, the robot arm 2, the storage chamber 3, the workpiece conveyance portion 4*b*, the gas supply portion 5, and the gas blowing portion 6.

The workpiece conveyance portion 4*b* includes the holding portion 41*b* configured to hold the workpiece 150 and the transfer portion 42 configured to transfer the holding portion 41*b*. The holding portion 41*b* can move the workpiece 150 relative to the transfer portion 42, and the holding portion 41*b* moves the workpiece 150 with six degrees of freedom, for example. On this account, at the time when the electron beam is applied from the electron beam emission portion 1 to the paint 151, a positional relationship between the electron beam emission portion 1 and the workpiece 150 is adjusted in collaboration between the robot arm 2 and the holding portion 41*b*. Accordingly, as the electron beam emission portion 1 and the workpiece 150 are moved, the electron beam emission portion 1 can scan the workpiece 150.

Note that the other configurations and operations of the third embodiment are generally the same as those in the second embodiment.

Effects

In the third embodiment, as the holding portion 41*b* can move the workpiece 150 as described above, a moving amount of the robot arm 2 can be decreased in collaboration between the robot arm 2 and the holding portion 41*b*. This makes it possible to downsize the storage chamber 3.

Note that the other effects of the third embodiment are the same as those in the second embodiment.

Fourth Embodiment

Figure 6:
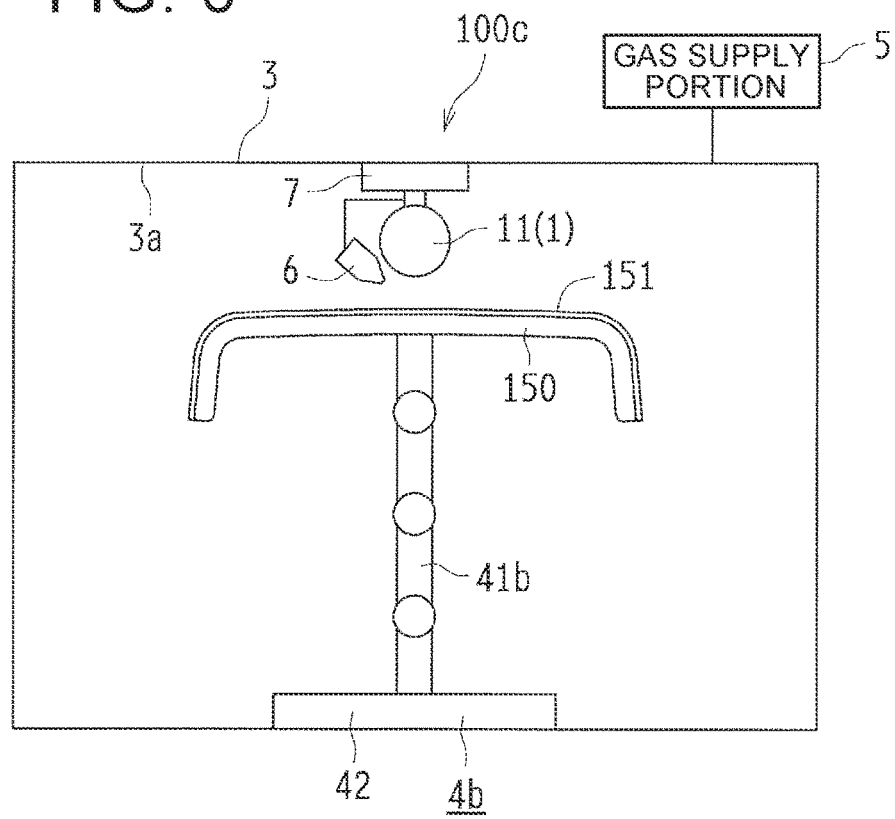
FIG. 6 is a schematic view to describe a paint hardening device according to a fourth embodiment.

Referring now to FIG. 6, a paint hardening device 100*c* according to a fourth embodiment of the present disclosure will be described. In the paint hardening device 100*c* of the fourth embodiment, the robot arm 2 (see FIG. 5) is not provided, and the electron beam emission portion 1 and the gas blowing portion 6 are slidably provided on an inner side 3*a* of a top face of the storage chamber 3. Note that the inner side 3*a* of the top face is one example of an "inner surface" in the present disclosure.

As illustrated in FIG. 6, the paint hardening device 100*c* includes the electron beam emission portion 1, the storage chamber 3, the workpiece conveyance portion 4*b*, the gas supply portion 5, the gas blowing portion 6, and a slide member 7.

The electron beam emission portion 1 and the gas blowing portion 6 are attached to the slide member 7. The slide member 7 is provided on the inner side 3*a* of the top face of the storage chamber 3. The slide member 7 is configured to be movable horizontally. That is, the electron beam emission portion 1 and the gas blowing portion 6 are moved by the slide member 7 with two degrees of freedom. On this account, at the time when the electron beam is applied from the electron beam emission portion 1 to the paint 151, the positional relationship between the electron beam emission portion 1 and the workpiece 150 is adjusted in collaboration between the slide member 7 and the holding portion 41*b*. Accordingly, as the electron beam emission portion 1 and the workpiece 150 are moved, the electron beam emission portion 1 can scan the workpiece 150.

Note that the other configurations and operations of the fourth embodiment are generally the same as those in the third embodiment.

Effects

In the fourth embodiment, the electron beam emission portion 1 and the gas blowing portion 6 are slidably provided on the inner side 3*a* of the top face of the storage chamber 3 as described above. Accordingly, the electron beam emission portion 1 and the gas blowing portion 6 are moved along the top face, so that the electron beam emission portion 1 and the gas blowing portion 6 can be moved in a stable state.

Note that the other effects of the fourth embodiment are the same as those in the third embodiment.

Fifth Embodiment

Figure 7:
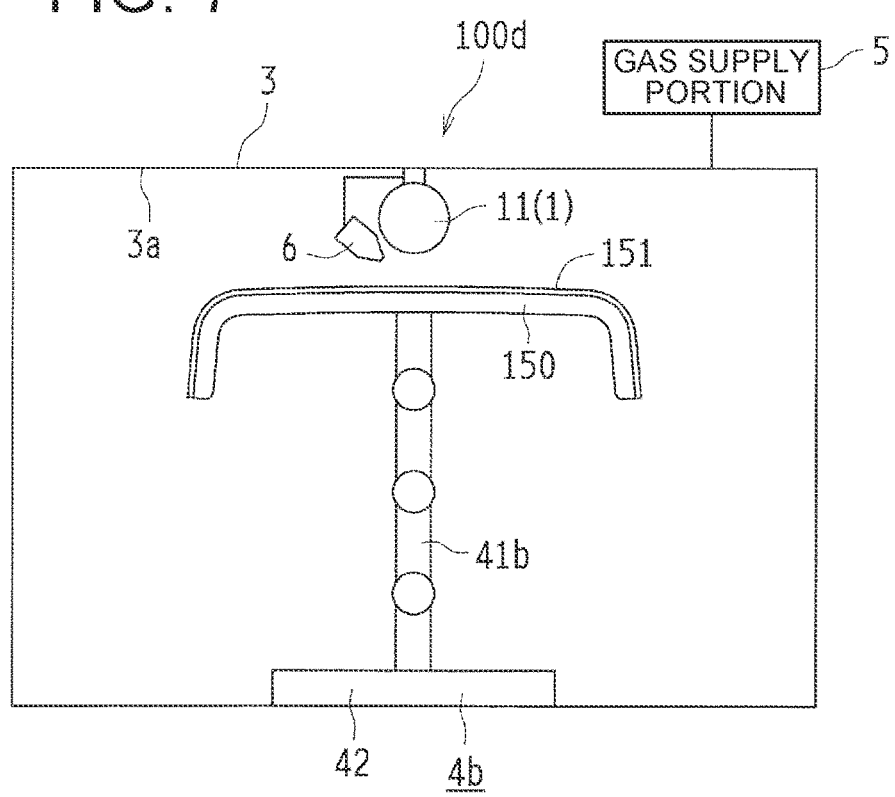
FIG. 7 is a schematic view to describe a paint hardening device according to a fifth embodiment.

Referring now to FIG. 7, a paint hardening device 100*d* according to a fifth embodiment of the present disclosure will be described. In the paint hardening device 100*d* of the fifth embodiment, the slide member 7 (see FIG. 6) is not provided, and the electron beam emission portion 1 and the gas blowing portion 6 are fixed to the inner side 3*a* of the top face of the storage chamber 3.

As illustrated in FIG. 7, the paint hardening device 100*d* includes the electron beam emission portion 1, the storage chamber 3, the workpiece conveyance portion 4*b*, the gas supply portion 5, and the gas blowing portion 6.

The electron beam emission portion 1 and the gas blowing portion 6 are attached to the inner side 3*a* of the top face of the storage chamber 3 so that the electron beam emission portion 1 and the gas blowing portion 6 do not move. The workpiece conveyance portion 4*b* is configured to move the workpiece 150 relative to the electron beam emission portion 1 thus fixed. The workpiece 150 is held by the workpiece conveyance portion 4*b*. More specifically, when the holding portion 41*b* and the transfer portion 42 of the workpiece conveyance portion 4*b* move, the workpiece 150 is moved so that the surface of the paint 151 on the workpiece 150 sequentially passes through a predetermined position facing the electron beam emission portion 1. Accordingly, at the time when the electron beam is applied from the electron beam emission portion 1 to the paint 151, the workpiece 150 is moved relative to the electron beam emission portion 1 by the holding portion 41b and the transfer portion 42, so that the electron beam emission portion 1 scans the workpiece 150. Note that, at the time when the electron beam is applied from the electron beam emission portion 1 to the paint 151, the workpiece 150 may be moved relative to the electron beam emission portion 1 only by the holding portion 41b.

Note that the other configurations and operations of the fifth embodiment are generally the same as those in the fourth embodiment.

Effects

In the fifth embodiment, the electron beam emission portion 1 and the gas blowing portion 6 are fixed to the inner side 3a of the top face of the storage chamber 3 as described above. Hereby, while the electron beam emission portion 1 and the gas blowing portion 6 are stabilized, the workpiece 150 and the electron beam emission portion 1 can be moved relative to each other. Further, it is possible to simplify a drive control at the time when the electron beam emission portion 1 scans the workpiece 150.

Note that the other effects of the fifth embodiment are the same as those in the fourth embodiment.

Sixth Embodiment

Figure 8A:
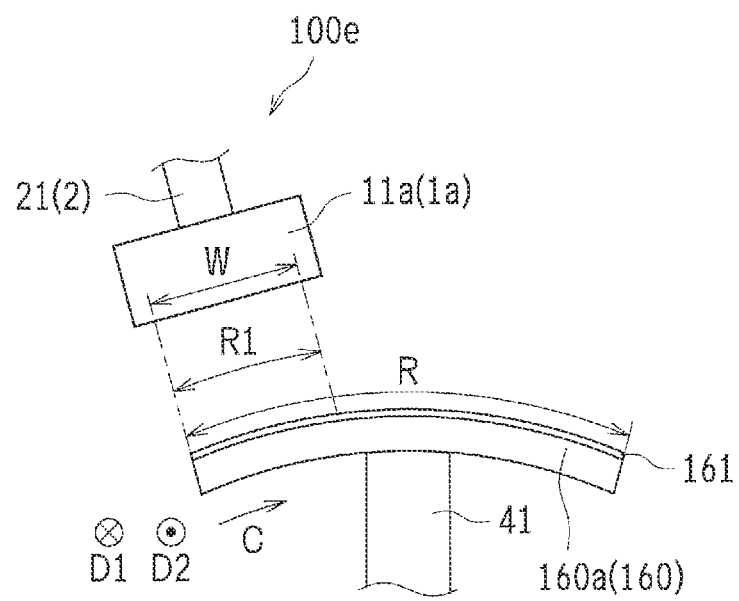
FIG. 8A is a schematic view (Part 1) illustrating an electron beam emission portion and a workpiece in an enlarged manner so as to describe a paint hardening device according to a sixth embodiment and a drawing viewed from a lateral side.
Figure 8B:
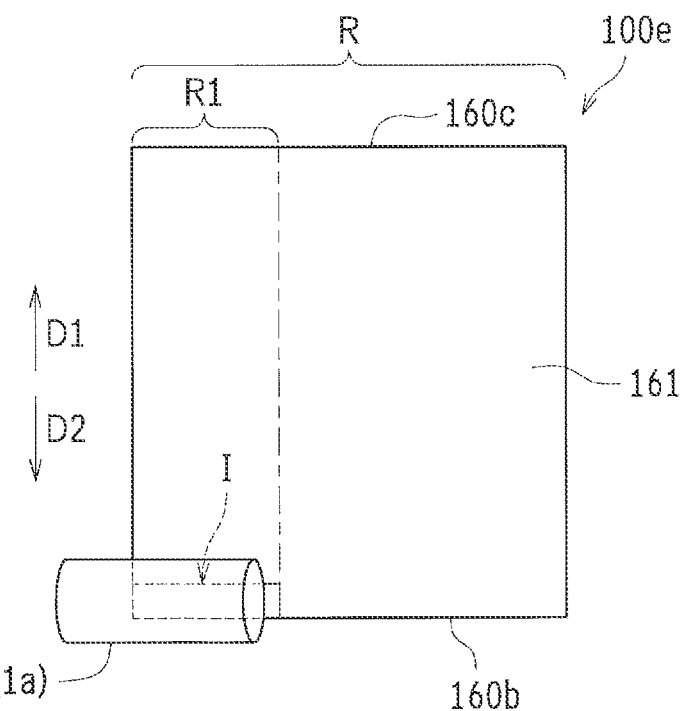
FIG. 8B is a drawing when
Figure 9A:
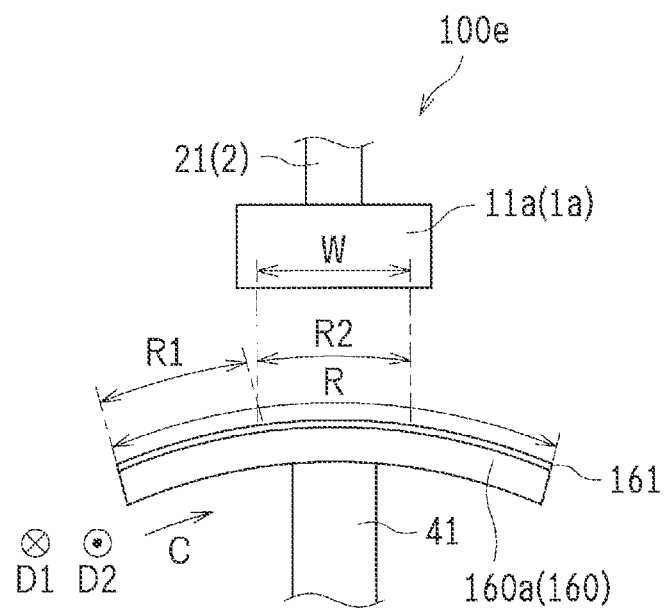
FIG. 9A is a schematic view (Part 2) illustrating the electron beam emission portion and the workpiece in an enlarged manner so as to describe the paint hardening device according to the sixth embodiment and a drawing viewed from the lateral side.
Figure 9B:
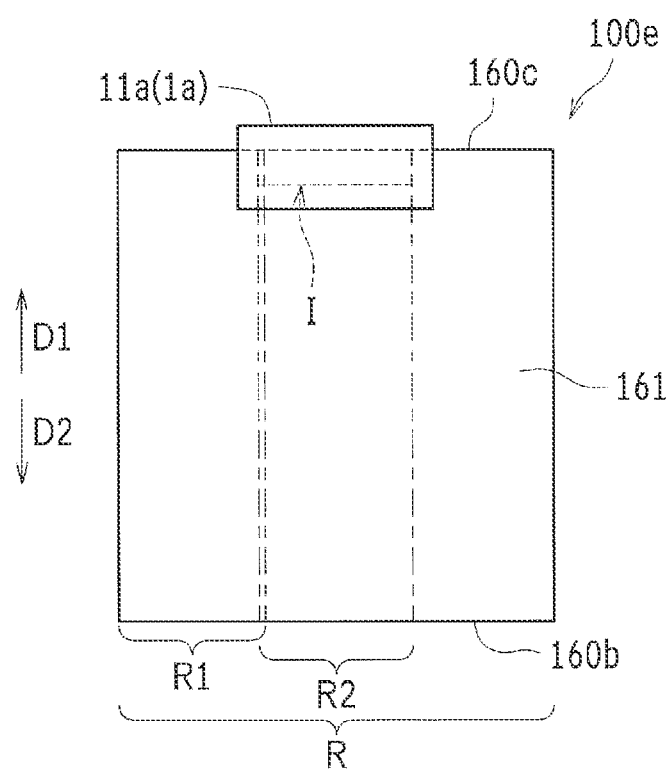
FIG. 9B is a drawing when
Figure 10A:
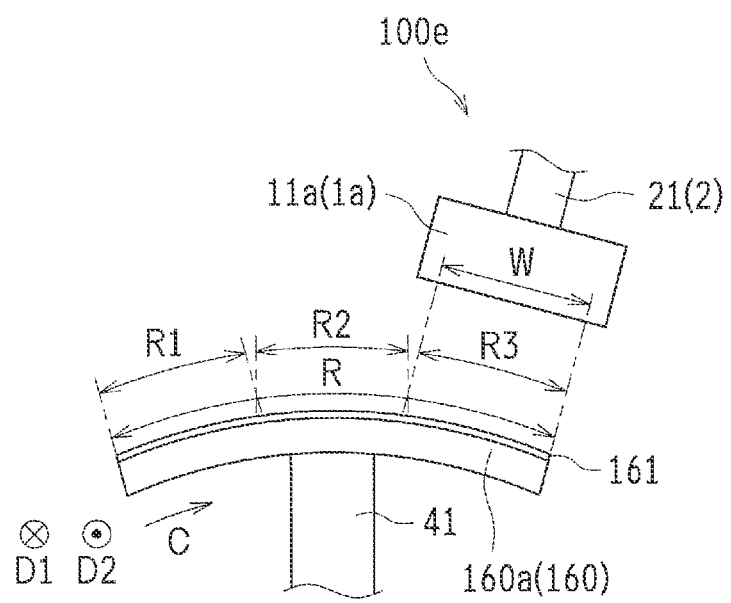
FIG. 10A is a schematic view (Part 3) illustrating the electron beam emission portion and the workpiece in an enlarged manner so as to describe the paint hardening device according to the sixth embodiment and a drawing viewed from the lateral side.
Figure 10B:
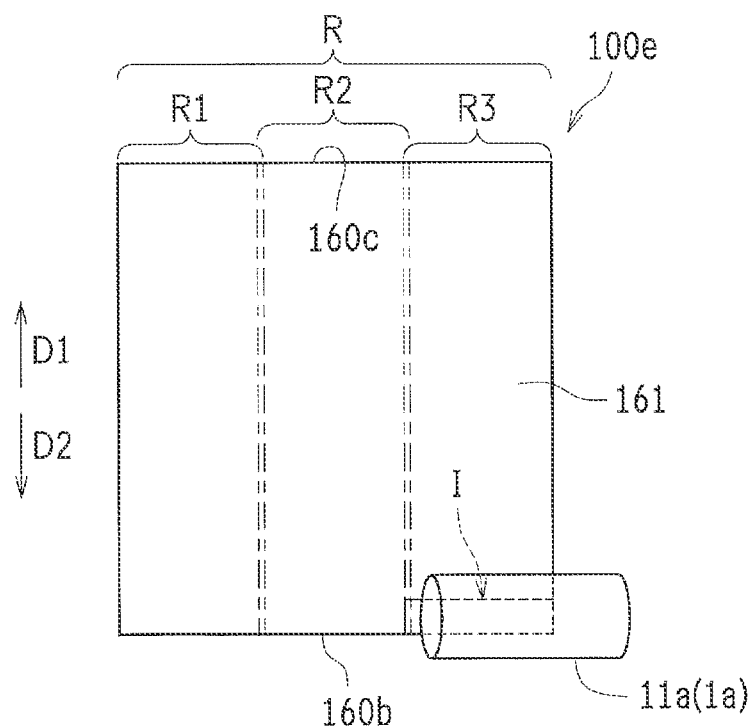
FIG. 10B is a drawing when

Referring now to FIGS. 8A, 8B, FIGS. 9A, 9B, and FIGS. 10A, 10B, a paint hardening device 100e according to a sixth embodiment of the present disclosure will be described. The paint hardening device 100e of the sixth embodiment is provided with an evacuated tubular electron beam emission portion 1a, for example, instead of the electron beam emission portion 1 (see FIG. 1) of the first embodiment. Note that, in terms of FIGS. 8A, 8B, FIGS. 9A, 9B, and FIGS. 10A, 10B, FIGS. 8A, 9A, 10A are drawings when the electron beam emission portion 1a and a workpiece 160 are viewed from a lateral side, and FIGS. 8B, 9B, 10B are drawings when FIGS. 8A, 9A, 10A are viewed from above, respectively.

The electron beam emission portion 1a includes a vacuum pipe 11a in which an electron beam generation source (not shown) is enclosed. The electron beam emission portion 1a is configured to emit an electron beam through a window (not shown) provided in the vacuum pipe 11a. The electron beam emission portion 1a is smaller than the electron beam emission portion 1 described above and can emit an electron beam with a narrow width in comparison with the electron beam emission portion 1. On this account, as illustrated in FIG. 8A, the electron beam emission portion 1a is configured such that a width W of the electron beam to be emitted from the electron beam emission portion 1a is narrower than an electron-beam applied region R (also referred to as the applied region R) in the workpiece 160. That is, an electron-beam emission range I (also referred to as the emission range I) (see FIG. 8B) in which the electron beam emission portion 1a emits the electron beam to paint 161 on the workpiece 160 is smaller than the applied region R. On this account, the electron beam is caused to scan the paint 161, so that the electron beam is applied to the whole applied region R in the workpiece 160.

Note that the workpiece 160 is a vehicle bumper made of resin, for example, and a part of the workpiece 160 is illustrated in an enlarged manner for convenience of description. The workpiece 160 is formed in a three-dimensional shape having a curved portion 160a, and the paint 161 that is an electron-beam curable paint is applied to a surface of the workpiece 160. A region of the workpiece 160 where the paint 161 is applied corresponds to the applied region R.

Accordingly, in the paint hardening device 100e, when the electron beam is applied to the paint 161 on the workpiece 160, a distance between the electron beam emission portion 1a and the paint 161 on the workpiece 160 and an application angle of the electron beam to the paint 161 on the workpiece 160 can be adjusted in accordance with a shape of the workpiece 160. The paint hardening device 100e is configured to apply the electron beam to the whole applied region R in the workpiece 160 while the paint hardening device 100e appropriately adjusts the distance from the electron beam emission portion 1a to the paint 161 and the application angle of the electron beam.

For example, the paint hardening device 100e is configured such that, when the paint 161 on the curved portion 160a of the workpiece 160 is hardened, the paint hardening device 100e applies the electron beam to the paint 161 on the workpiece 160 while the paint hardening device 100e repeatedly moves the electron beam emission portion 1a in a principal direction (D1 and D2 directions) and repeatedly moves the electron beam emission portion 1a in a secondary direction (a C direction). The secondary direction is a direction perpendicular to the principal direction and is a direction along a curved shape of the workpiece 160.

More specifically, in the paint hardening device 100e, while the electron beam is emitted from the electron beam emission portion 1a, the electron beam emission portion 1a is moved to a first side (the D1 direction) in the principal direction as illustrated in FIG. 8B. At this time, as illustrated in FIG. 8A, the electron beam emission portion 1a is placed such that the window through which the electron beam is emitted faces the surface of the workpiece 160 (an emission direction of the electron beam is along a direction perpendicular to a tangential direction of the curved portion 160a), and a width direction (a longitudinal direction of the emission range I) of the electron beam is along the secondary direction. A distance between a part (the emission range I) of the paint 161 on the workpiece 160 and the electron beam emission portion 1a is set to a predetermined distance. The part of the paint 161 is a part to which the electron beam is applied. The predetermined distance is a distance (e.g., 10 mm to 30 mm) set in advance. Hereby, the paint 161 in a first applied region R1 in the workpiece 160 is hardened.

Subsequently, in the paint hardening device 100e, as illustrated in FIGS. 9A, 9B, the electron beam emission portion 1a is moved in the secondary direction (the C direction), and after that, the electron beam emission portion 1a is moved to a second side (the D2 direction) in the principal direction while the electron beam is emitted from the electron beam emission portion 1a. At this time, the electron beam emission portion 1a is placed such that the window through which the electron beam is emitted faces the surface of the workpiece 160, and the width direction of the electron beam is along the secondary direction. A distance between a part of the paint 161 on the workpiece 160 and the electron beam emission portion 1a is set to the predetermined distance. The part of the paint 161 is a part to which the electron beam is applied. Hereby, the paint 161 in a second applied region R2 in the workpiece 160 is hardened, the second applied region R2 being adjacent to the first applied region R1 in the workpiece 160. The second applied region R2 is set to slightly overlap the first applied region R1 in the secondary direction.

Subsequently, in the paint hardening device 100e, as illustrated in FIGS. 10A, 10B, the electron beam emission portion 1a is moved in the secondary direction (the C direction), and after that, the electron beam emission portion 1a is moved to the first side (the D1 direction) in the principal direction while the electron beam is emitted from the electron beam emission portion 1a. At this time, the electron beam emission portion 1a is placed such that the window through which the electron beam is emitted faces the surface of the workpiece 160, and the width direction of the electron beam is along the secondary direction. A distance between a part of the paint 161 on the workpiece 160 and the electron beam emission portion 1a is set to a predetermined distance. The part of the paint 161 is a part to which the electron beam is applied. Hereby, the paint 161 in a third applied region R3 in the workpiece 160 is hardened, the third applied region R3 being adjacent to the second applied region R2 in the workpiece 160. The third applied region R3 is set to slightly overlap the second applied region R2 in the secondary direction. Hereby, the paint 161 in the whole applied region R in the workpiece 160 is hardened.

Accordingly, the paint hardening device 100e is configured such that, while the electron-beam emission range I is shifted in the secondary direction in a state where the longitudinal direction of the electron-beam emission range I is along the secondary direction, the electron-beam emission range I is moved to reciprocate in the principal direction between a first end portion 160b and a second end portion 160c of the workpiece 160.

Note that the other configurations and operations of the sixth embodiment are generally the same as those in the first embodiment.

Effects

As described above, in the sixth embodiment, the electron beam with the narrow width W is emitted from the electron beam emission portion 1a. Hereby, the electron beam can be applied to the paint 161 on the workpiece 160 while the distance from the electron beam emission portion 1a to the paint 161 and the application angle of the electron beam are adjusted in accordance with the shape of the workpiece 160. That is, even when the workpiece 160 has a three-dimensional shape, it is possible to appropriately adjust the distance from the electron beam emission portion 1a to the paint 161 and the application angle of the electron beam at the time when the electron beam is applied to the paint 161 in each part of the workpiece 160. Hereby, the whole paint 161 on the workpiece 160 can be hardened accurately.

Note that the other effects of the sixth embodiment are the same as those in the first embodiment.

Other Embodiments

It should be noted that the embodiments described herein are just examples in all respects and are not limitative. Accordingly, the technical scope of the present disclosure is not interpreted only by the above embodiments but is defined based on the description in Claims. Further, the technical scope of the present disclosure includes all modifications made within the meaning and scope equivalent to Claims.

For example, the first to fifth embodiments deal with examples in which the workpiece 150 is a vehicle bumper made of resin. However, the present disclosure is not limited to this. The workpiece may be made of metal, and the workpiece may be a coated product other than a vehicle bumper. The same applies to the sixth embodiment.

Further, in the first to fifth embodiments, the paint 151 may be constituted by a single layer or may be constituted by a plurality of layers. The same applies to the sixth embodiment.

Further, the first to sixth embodiments deal with examples in which nitrogen gas is employed as an example of inert gas. However, the present disclosure is not limited to this, and the inert gas may be helium gas or the like.

Further, the second to fourth embodiments deal with examples in which the electron beam emission portion 1 and the gas blowing portion 6 are moved integrally. However, the present disclosure is not limited to this, and the electron beam emission portion and the gas blowing portion may be moved independently.

Further, the second embodiment deals with an example in which the gas supply portion 5 is provided. However, the present disclosure is not limited to this, and the gas supply portion may not be provided. That is, at least the electron-beam passing region should be exposed to the inert gas atmosphere.

Further, the third to fifth embodiments deal with examples in which the gas supply portion 5 and the gas blowing portion 6 are provided. However, the present disclosure is not limited to this, and only either one of the gas supply portion and the gas blowing portion may be provided.

Further, the fourth and fifth embodiments deal with examples in which the electron beam emission portion 1 and the gas blowing portion 6 are provided on the inner side 3a of the top face of the storage chamber 3. However, the present disclosure is not limited to this, and the electron beam emission portion and the gas blowing portion may be provided on a bottom face of the storage chamber.

Further, the sixth embodiment deals with an example in which the evacuated tubular electron beam emission portion 1a is provided instead of the electron beam emission portion 1 of the first embodiment. However, the present disclosure is not limited to this, and in the second to fifth embodiments, an evacuated tubular electron beam emission portion may be provided instead of the electron beam emission portion. That is, the electron beam emission portion 1a of the sixth embodiment may be applied to the second to fifth embodiments.

Further, the sixth embodiment deals with an example in which the first applied region R1 and the second applied region R2 adjacent to each other slightly overlap each other. However, the present disclosure is not limited to this, and the first applied region and the second applied region adjacent to each other may not overlap each other. That is, the first applied region and the second applied region adjacent to each other may be placed without any gap such that an end portion of the first applied region on a side close to the second applied region and an end portion of the second applied region on a side close to the first applied region fit each other. Note that the same applies to the second applied region R2 and the third applied region R3 adjacent to each other.

Further, the sixth embodiment deals with an example in which the electron beam emission portion 1a performs scanning three times between the first end portion 160b and the second end portion 160c of the workpiece 160. However, the present disclosure is not limited to this, and the electron beam emission portion may be configured to perform scanning twice or four or more times between a first end portion and a second end portion of a workpiece.

Figure 11:
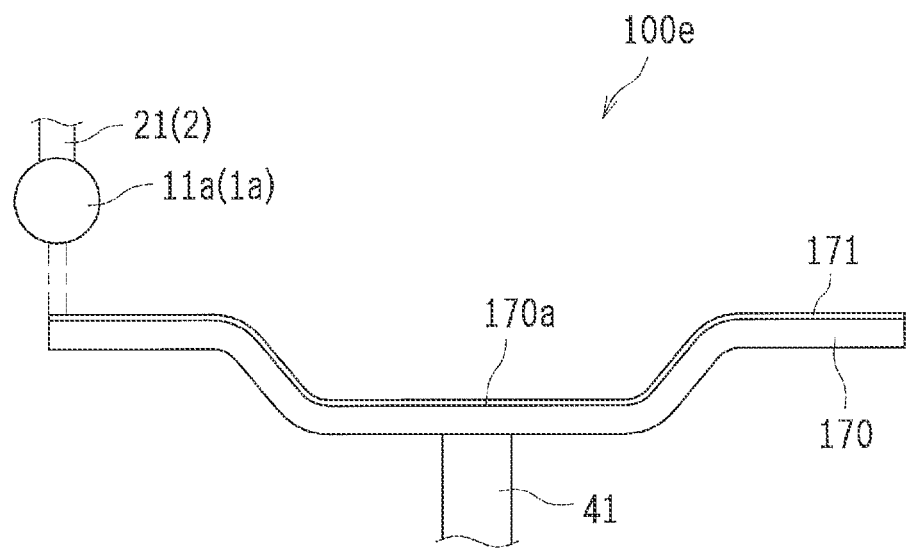
FIG. 11 is a schematic view (Part 1) to describe an operation of the paint hardening device of the sixth embodiment when the workpiece has a recessed portion.
Figure 12:
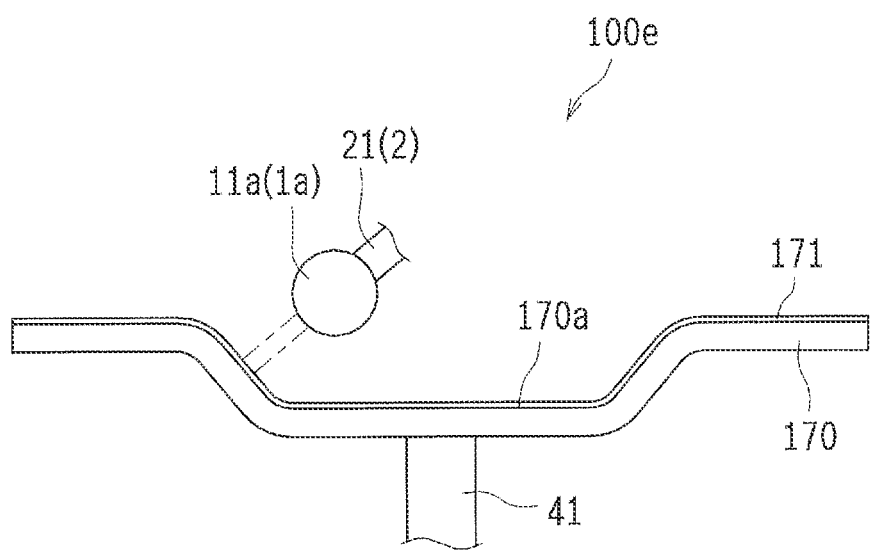
FIG. 12 is a schematic view (Part 2) to describe the operation of the paint hardening device of the sixth embodiment when the workpiece has the recessed portion.
Figure 13:
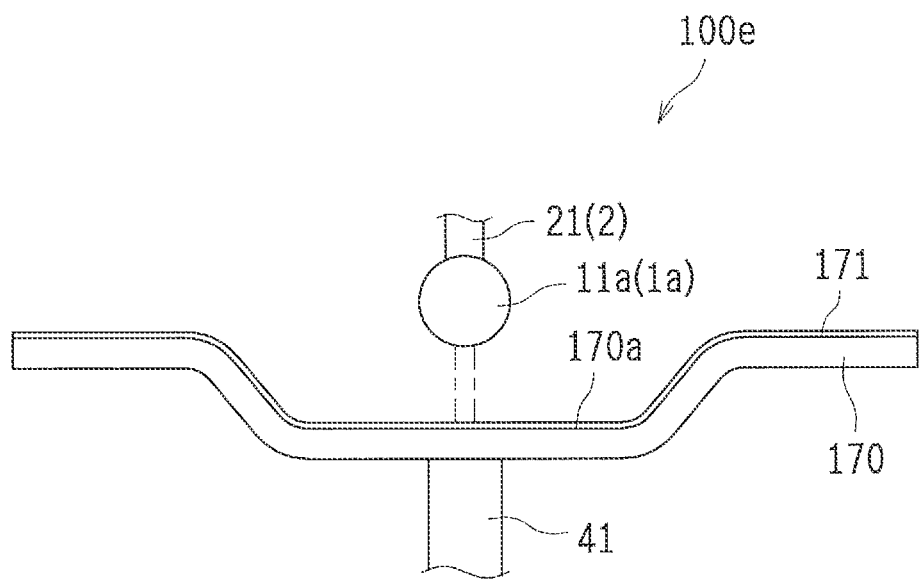
FIG. 13 is a schematic view (Part 3) to describe the operation of the paint hardening device of the sixth embodiment when the workpiece has the recessed portion.

Further, the sixth embodiment deals with an example in which the workpiece 160 is formed in a three-dimensional shape having the curved portion 160a. However, the present disclosure is not limited to this, and as illustrated in FIGS. 11 to 13, a workpiece 170 may be formed in a three-dimensional shape having a recessed portion 170a. In this case, first, as illustrated in FIG. 11, the electron beam emission portion 1a is placed such that the window through which the electron beam is emitted faces a surface of the workpiece 170, and the width direction of the electron beam is along a direction perpendicular to the plane of paper of FIG. 11. Further, the electron beam emission portion 1a is placed in a first end portion (a left end portion in FIG. 11) of the workpiece 170, and a distance to a part of paint 171 on the workpiece 170 is set to a predetermined distance. The part of the paint 171 is a part to which the electron beam is applied. While the electron beam emission portion 1a applies the electron beam to the paint 171 on the workpiece 170, the electron beam emission portion 1a is moved horizontally along the surface of the workpiece 170 with the predetermined distance being maintained. Subsequently, when the electron beam emission portion 1a approaches an inclined surface (a side face of the recessed portion 170a) of the workpiece 170, an angle and a travel direction of the electron beam emission portion 1a are adjusted in order to maintain the distance from the electron beam emission portion 1a to the paint 171 at the predetermined distance and to maintain an application angle of the electron beam to the paint 171, as illustrated in FIG. 12. When the electron beam emission portion 1a approaches the bottom face of the recessed portion 170a of the workpiece 170, the angle and the travel direction of the electron beam emission portion 1a are adjusted in order to maintain the distance from the electron beam emission portion 1a to the paint 171 at the predetermined distance and to maintain the application angle of the electron beam to the paint 171, as illustrated in FIG. 13. After that, when the electron beam emission portion 1a is moved to a second end portion of the workpiece 170 with the angle and the travel direction of the electron beam emission portion 1a being adjusted in accordance with a surface shape of the workpiece 170, the electron beam emission portion 1a is moved in a direction perpendicular to the plane of paper of FIG. 13 just by an electron-beam emission range. Subsequently, while the electron beam emission portion 1a is moved from the second end portion to the first end portion of the workpiece 170, application of the electron beam to the paint 171 on the workpiece 170 is performed in a similar manner. After that, the above operation is performed repeatedly, so that the electron beam is applied to the whole paint 171 on the workpiece 170. Thus, the distance from the electron beam emission portion 1a to the paint 171 and the application angle of the electron beam are adjusted appropriately in accordance with the surface shape of the workpiece 170. This makes it possible to harden the whole paint 171 on the workpiece 170 with accuracy.

Further, the sixth embodiment deals with an example in which, while the electron-beam emission range I is shifted in the secondary direction, the electron-beam emission range I is moved to reciprocate in the principal direction between the first end portion 160b and the second end portion 160c of the workpiece 160. However, the present disclosure is not limited to this, and any scanning pattern of the electron beam can be employed.

Figure 14:
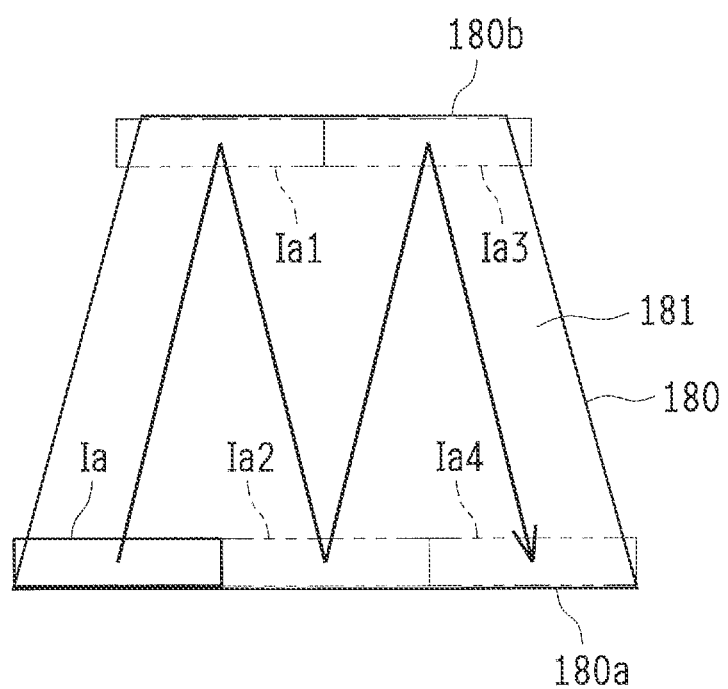
FIG. 14 is a drawing to describe a first modification of a scanning pattern of an electron beam in the paint hardening device of the sixth embodiment.

For example, like a first modification illustrated in FIG. 14, an electron-beam emission range Ia may be moved to reciprocate in a zigzag manner between a first end portion 180a and a second end portion 180b of a workpiece 180. That is, the electron-beam emission range Ia may be moved along an arrow so that the electron-beam emission range Ia sequentially passes through emission ranges Ia1, Ia2, Ia3, Ia4 shown in virtual lines. Whole paint 181 on the workpiece 180 may be hardened as such.

Figure 15:
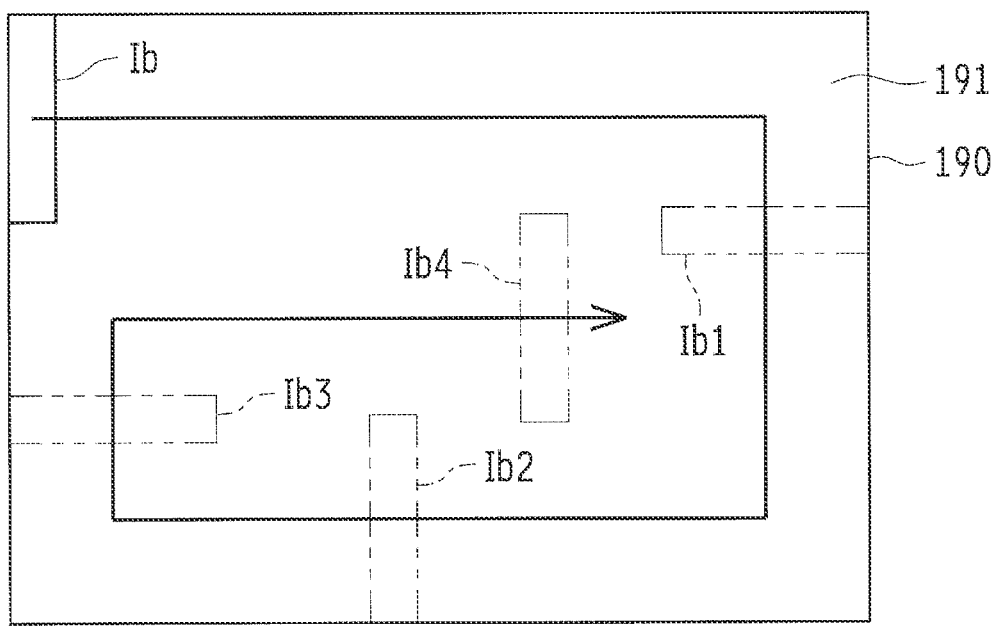
FIG. 15 is a drawing to describe a second modification of the scanning pattern of the electron beam in the paint hardening device of the sixth embodiment.

Further, like a second modification illustrated in FIG. 15, an electron-beam emission range Ib may be moved to draw a swirl from an outer edge side of a workpiece 190 toward its center. That is, the electron-beam emission range Ib may be moved along an arrow so that the electron-beam emission range Ib sequentially passes through emission ranges Ib1, Ib2, Ib3, Ib4 shown in virtual lines. Whole paint 191 on the workpiece 190 may be hardened as such.

The present disclosure is applicable to a paint hardening device and a paint hardening method each for hardening paint by an electron beam, the paint being applied to a workpiece.

What is claimed is:

1. A paint hardening device for hardening paint applied to a workpiece, the paint hardening device comprising:
   an electron beam emission portion configured to emit an electron beam to harden the paint;
   a storage chamber in which the electron beam emission portion is accommodated, wherein the paint hardening device is configured to move the workpiece and the electron beam emission portion relative to each other while the electron beam is being applied to the paint from the electron beam emission portion in a state where an inert gas atmosphere is formed at least in an electron-beam passing region where the electron beam passes in the storage chamber, the electron beam being applied to the paint from the electron beam emission portion; and
   a workpiece conveyance portion including a holding portion configured to hold the workpiece and a transfer portion configured to transfer the holding portion,
   wherein the holding portion is configured to move the workpiece relative to the transfer portion, the workpiece being held by the holding portion.

2. The paint hardening device according to claim 1, further comprising a gas supply portion configured to supply inert gas into the storage chamber.

3. The paint hardening device according to claim 1, further comprising a robot arm having a distal end provided with the electron beam emission portion, the robot arm being configured to move the electron beam emission portion.

4. The paint hardening device according to claim 1, wherein
   the electron beam emission portion is provided on an inner surface of the storage chamber and is configured to be movable horizontally.

5. The paint hardening device according to claim 1,
   the electron beam emission portion is fixed to an inner surface of the storage chamber.

6. The paint hardening device according to claim 1, further comprising a gas blowing portion configured to blow inert gas to the electron-beam passing region.

7. The paint hardening device according to claim 1, wherein the electron beam emission portion is configured to emit an electron beam having a width narrower than an electron-beam applied region in the workpiece.

8. The paint hardening device according to claim 1, wherein the workpiece is formed in a three-dimensional shape.

9. A paint hardening method for hardening paint by an electron beam, the paint being applied to a workpiece, the paint hardening method comprising:
   a step of forming an inert gas atmosphere at least in an electron-beam passing region where the electron beam passes in a storage chamber in which an electron beam emission portion is stored, the electron beam being applied to the paint from the electron beam emission portion;

a step of applying the electron beam to the paint from the electron beam emission portion in a state where the inert gas atmosphere is formed in the electron-beam passing region;

a step of moving the workpiece and the electron beam emission portion relative to each other while the electron beam is being applied to the paint from the electron beam emission portion; and a step of providing a workpiece conveyance portion including a holding portion for holding the workpiece and a transfer portion for transferring the holding portion, wherein the holding portion moves the workpiece relative to the transfer portion, the workpiece being held by the holding portion.

* * * * *